(12) United States Patent
Kindaichi

(10) Patent No.: US 11,708,646 B2
(45) Date of Patent: Jul. 25, 2023

(54) CRUCIBLE HAVING AN IMPROVED CRYSTAL GROWTH BASE FOR MANUFACTURING SILICON CARBIDE SINGLE CRYSTAL AND METHOD OF USE

(71) Applicant: SHOWA DENKO K.K., Tokyo (JP)

(72) Inventor: Rimpei Kindaichi, Chiba (JP)

(73) Assignee: SHOWA DENKO K.K., Tokyo (JP)

(*) Notice: Subject to any disclaimer, the term of this patent is extended or adjusted under 35 U.S.C. 154(b) by 0 days.

(21) Appl. No.: 17/562,438

(22) Filed: Dec. 27, 2021

(65) Prior Publication Data

US 2022/0205137 A1 Jun. 30, 2022

(30) Foreign Application Priority Data

Dec. 28, 2020 (JP) .................. 2020-218521

(51) Int. Cl.
| | |
|---|---|
| *C30B 23/02* | (2006.01) |
| *C30B 35/00* | (2006.01) |
| *H01L 21/205* | (2006.01) |
| *C30B 23/06* | (2006.01) |
| *C30B 29/36* | (2006.01) |

(52) U.S. Cl.
CPC .......... *C30B 35/002* (2013.01); *C30B 23/025* (2013.01); *C30B 23/066* (2013.01); *C30B 29/36* (2013.01); *H01L 21/2053* (2013.01)

(58) Field of Classification Search
CPC ....... C30B 23/00; C30B 23/002; C30B 23/02; C30B 23/025; C30B 23/06; C30B 23/066; C30B 29/00; C30B 29/10; C30B 29/36; C30B 35/00; C30B 35/002; H01L 21/2053

USPC ............. 117/84, 106, 200, 204, 937, 951
See application file for complete search history.

(56) References Cited

U.S. PATENT DOCUMENTS

| | | | |
|---|---|---|---|
| 2013/0071643 A1* | 3/2013 | Harada | C30B 35/007 117/106 |
| 2016/0340796 A1* | 11/2016 | Hori | C30B 33/02 |

FOREIGN PATENT DOCUMENTS

| | | | | |
|---|---|---|---|---|
| JP | 2004-269297 A | | 9/2004 | |
| JP | 2004269297 A | * | 9/2004 | |
| JP | 2008-88036 A | | 4/2008 | |
| JP | 2009-120419 A | | 6/2009 | |
| JP | 5287840 B2 | * | 9/2013 | C30B 25/12 |
| KR | 20170049847 A | * | 5/2017 | |

* cited by examiner

*Primary Examiner* — Kenneth A Bratland, Jr.
(74) *Attorney, Agent, or Firm* — Sughrue Mion, PLLC

(57) ABSTRACT

A silicon carbide single crystal manufacturing apparatus includes a crucible constituted by a crucible body and a crucible lid and a base having a crucible lid side surface supported by the lower surface of the crucible lid, and a seed crystal mounting surface on which the seed crystal is mounted and which is a surface on the opposite side of the crucible lid side surface, wherein the base is made of graphite material, the area of the seed crystal mounting surface is larger than the area of the crucible lid side surface, and the base has at least of a portion in which the cross-sectional area orthogonal to the vertical direction connecting the crucible lid side surface and the seed crystal mounting surface is gradually reduced, and a portion that is getting smaller gradually, from the surface of the seed crystal mounting surface toward the crucible lid side surface.

11 Claims, 9 Drawing Sheets

FIG. 10

| r2 | r1 | h | SHEAR STRESS RATIO |
|---|---|---|---|
| 80 | 40 | 20 | 0.37 |
| 80 | 40 | 30 | 0.55 |
| 80 | 40 | 40 | 0.66 |
| 80 | 40 | 50 | 0.74 |
| 80 | 40 | 60 | 0.79 |
| 80 | 40 | 70 | 0.82 |
| 80 | 40 | 80 | 0.84 |
| 80 | 50 | 20 | 0.50 |
| 80 | 50 | 30 | 0.66 |
| 80 | 50 | 40 | 0.75 |
| 80 | 50 | 50 | 0.80 |
| 80 | 50 | 60 | 0.84 |
| 80 | 50 | 70 | 0.86 |
| 80 | 50 | 80 | 0.87 |
| 80 | 60 | 20 | 0.67 |
| 80 | 60 | 30 | 0.78 |
| 80 | 60 | 40 | 0.83 |
| 80 | 60 | 50 | 0.86 |
| 80 | 60 | 60 | 0.88 |
| 80 | 60 | 70 | 0.89 |
| 80 | 60 | 80 | 0.90 |
| 80 | 70 | 20 | 0.84 |
| 80 | 70 | 30 | 0.87 |
| 80 | 70 | 40 | 0.90 |
| 80 | 70 | 50 | 0.91 |
| 80 | 70 | 60 | 0.92 |
| 80 | 70 | 70 | 0.93 |
| 80 | 70 | 80 | 0.94 |

FIG. 13

| r2 | r1 | h | SHEAR STRESS RATIO |
|---|---|---|---|
| 80 | 40 | 20 | 0.46 |
| 80 | 40 | 30 | 0.48 |
| 80 | 40 | 40 | 0.52 |
| 80 | 40 | 50 | 0.56 |
| 80 | 40 | 60 | 0.60 |
| 80 | 40 | 70 | 0.64 |
| 80 | 40 | 80 | 0.67 |
| 80 | 50 | 20 | 0.59 |
| 80 | 50 | 30 | 0.51 |
| 80 | 50 | 40 | 0.55 |
| 80 | 50 | 50 | 0.61 |
| 80 | 50 | 60 | 0.66 |
| 80 | 50 | 70 | 0.70 |
| 80 | 50 | 80 | 0.73 |
| 80 | 60 | 20 | 0.68 |
| 80 | 60 | 30 | 0.63 |
| 80 | 60 | 40 | 0.64 |
| 80 | 60 | 50 | 0.70 |
| 80 | 60 | 60 | 0.75 |
| 80 | 60 | 70 | 0.78 |
| 80 | 60 | 80 | 0.81 |
| 80 | 70 | 20 | 0.77 |
| 80 | 70 | 30 | 0.61 |
| 80 | 70 | 40 | 0.65 |
| 80 | 70 | 50 | 0.70 |
| 80 | 70 | 60 | 0.75 |
| 80 | 70 | 70 | 0.78 |
| 80 | 70 | 80 | 0.81 |
| 80 | 75 | 20 | 0.84 |
| 80 | 75 | 30 | 0.87 |
| 80 | 75 | 40 | 0.89 |
| 80 | 75 | 50 | 0.91 |
| 80 | 75 | 60 | 0.93 |
| 80 | 75 | 70 | 0.94 |
| 80 | 75 | 80 | 0.95 |

FIG. 15

| r2 | r1 | h | SHEAR STRESS RATIO |
|---|---|---|---|
| 100 | 40 | 20 | 0.44 |
| 100 | 40 | 30 | 0.43 |
| 100 | 40 | 40 | 0.46 |
| 100 | 40 | 50 | 0.48 |
| 100 | 40 | 60 | 0.51 |
| 100 | 40 | 70 | 0.54 |
| 100 | 40 | 80 | 0.56 |
| 100 | 50 | 20 | 0.57 |
| 100 | 50 | 30 | 0.45 |
| 100 | 50 | 40 | 0.47 |
| 100 | 50 | 50 | 0.50 |
| 100 | 50 | 60 | 0.53 |
| 100 | 50 | 70 | 0.56 |
| 100 | 50 | 80 | 0.60 |
| 100 | 60 | 20 | 0.64 |
| 100 | 60 | 30 | 0.54 |
| 100 | 60 | 40 | 0.49 |
| 100 | 60 | 50 | 0.53 |
| 100 | 60 | 60 | 0.58 |
| 100 | 60 | 70 | 0.61 |
| 100 | 60 | 80 | 0.64 |
| 100 | 70 | 20 | 0.69 |
| 100 | 70 | 30 | 0.64 |
| 100 | 70 | 40 | 0.57 |
| 100 | 70 | 50 | 0.58 |
| 100 | 70 | 60 | 0.63 |
| 100 | 70 | 70 | 0.67 |
| 100 | 70 | 80 | 0.71 |
| 100 | 80 | 20 | 0.72 |
| 100 | 80 | 30 | 0.72 |
| 100 | 80 | 40 | 0.68 |
| 100 | 80 | 50 | 0.68 |
| 100 | 80 | 60 | 0.72 |
| 100 | 80 | 70 | 0.76 |
| 100 | 80 | 80 | 0.79 |
| 100 | 90 | 20 | 0.79 |
| 100 | 90 | 30 | 0.81 |
| 100 | 90 | 40 | 0.80 |
| 100 | 90 | 50 | 0.82 |
| 100 | 90 | 60 | 0.85 |
| 100 | 90 | 70 | 0.87 |
| 100 | 90 | 80 | 0.89 |
| 100 | 95 | 20 | 0.85 |
| 100 | 95 | 30 | 0.88 |
| 100 | 95 | 40 | 0.89 |
| 100 | 95 | 50 | 0.91 |
| 100 | 95 | 60 | 0.92 |
| 100 | 95 | 70 | 0.93 |
| 100 | 95 | 80 | 0.94 |

CRUCIBLE HAVING AN IMPROVED CRYSTAL GROWTH BASE FOR MANUFACTURING SILICON CARBIDE SINGLE CRYSTAL AND METHOD OF USE

TECHNICAL FIELD

The present disclosure relates to a silicon carbide single crystal manufacturing apparatus and a method of manufacturing a silicon carbide single crystal.

Priority is claimed on Japanese Patent Application No. 2020-218521, filed Dec. 28, 2020, the content of which is incorporated herein by reference.

BACKGROUND ART

Silicon carbide (SiC) has a dielectric breakdown electric field that is one order of magnitude larger and a band gap that is three times larger than those of silicon (Si). Also, silicon carbide (SiC) has characteristics such as a thermal conductivity about three times higher than that of silicon (Si). It is expected that silicon carbide (SiC) will be able to be applied to power devices, high frequency devices, high temperature operating devices and the like. For this reason, in recent years, SiC epitaxial wafers have come to be used for the above-mentioned semiconductor devices.

The SiC epitaxial wafer is manufactured by growing a SiC epitaxial film, which is an active region of a SiC semiconductor device, on a silicon carbide single crystal substrate by a chemical vapor deposition method.

The silicon carbide single crystal substrate is produced by cutting out a silicon carbide single crystal. This silicon carbide single crystal can generally be obtained by a sublimation method. In the sublimation method, a seed crystal consisting of a silicon carbide single crystal is placed on a base placed in a graphite crucible, and the sublimation gas sublimated from the raw material powder in the crucible is supplied to the seed crystal by heating the crucible to grow the seed crystal into a larger silicon carbide single crystal.

In the sublimation method, it is necessary to hold the seed crystal on the base, and an adhesive is generally used for holding the seed crystal. Further, a stress buffering material may be used to relieve the stress (shear stress) generated in parallel with the adhesive surface caused by the difference in thermal expansion between the seed crystal and the graphite base (see, Patent Literature 1).

A local temperature distribution occurs on the surface of the seed crystal due to poor adhesion and tearing of the stress buffering material caused by the above stress when retaining seed crystals. When this temperature distribution is large, macro defects are likely to occur in the single crystal, and there is a problem that the quality of the single crystal is deteriorated.

CITATION LIST

Patent Literature

[Patent Literature 1]
Japanese Unexamined Patent Application, First Publication No. 2004-269297

[Patent Literature 2]
Japanese Unexamined Patent Application, First Publication No. 2008-88036

[Patent Literature 3]
Japanese Unexamined Patent Application, First Publication No. 2009-120419

SUMMARY OF INVENTION

Technical Problem

To solve this problem, in Patent Literature 2, a method of suppressing the shear stress generated between the seed crystal and the graphite base by using a member having a thermal expansion coefficient close to that of silicon carbide at room temperature as a member for retaining the seed crystal is proposed. In Patent Literature 3, a method of suppressing shear stress by constructing the base be composed of three or more layers of graphite members as a multi-layer structure and by bringing the average value of the thermal expansion coefficient of each graphite member close to the thermal expansion coefficient of the seed crystal, is proposed.

In the sublimation method, members are exposed to a wide temperature range of room temperature to 2400° C. or higher. In this range, it is not easy to more accurately grasp the thermal expansion coefficient of a member having a temperature dependence and to match the thermal expansion coefficient of a silicon carbide single crystal and that of a graphite base in each temperature zone. In addition, it is difficult to completely suppress the occurrence of macro defects even by using the growth methods as in Patent Literatures 2 and 3.

The shear stress generated by the difference in the thermal expansion coefficient between the silicon carbide seed crystal and the graphite base increases in the outer peripheral portion where the difference in the amount of thermal expansion becomes large. This is because the shear stress is a stress generated when the members in contact tend to be relatively displaced due to thermal expansion, and the displacement is larger toward the outer peripheral portion. Poor adhesion also often occurs in this area. This phenomenon becomes more likely to appear as the diameter of the seed crystal increases.

The present disclosure has been made in view of the above circumstances, and provides a silicon carbide single crystal manufacturing apparatus and a method of manufacturing a silicon carbide single crystal, which can reduce poor bonding between the silicon carbide seed crystal and the graphite base.

Solution to Problem

The present disclosure provides the following means to resolve the above problems.

According to a first aspect of the present disclosure, there is provided a silicon carbide single crystal manufacturing apparatus, including a crucible constituted by a crucible body and a crucible lid, a base having a crucible lid side surface supported by the lower surface of the crucible lid and a seed crystal mounting surface on which the seed crystal is mounted and which is a surface on the opposite side of the crucible lid side surface, wherein the base is made of graphite material, the area of the seed crystal mounting surface is larger than the area of the crucible lid side surface, and the base has at least of a portion in which the cross-sectional area orthogonal to the vertical direction connecting the crucible lid side surface and the seed crystal mounting surface is gradually reduced, and a portion that is getting smaller gradually, from the surface of the seed crystal mounting surface toward the crucible lid side surface.

In the silicon carbide single crystal manufacturing apparatus according to the first aspect, the base may have a truncated cone shape.

In the silicon carbide single crystal manufacturing apparatus according to the first aspect, assuming that the crucible lid side surface of the base is circular in which its radius is r1, the seed crystal mounting surface is circular in which its radius is r2, and the height of the base is h, $(r2-r1)/h > 0.15$ may be satisfied.

In the silicon carbide single crystal manufacturing apparatus according to the first aspect, the radius r1, the radius r2, and the height h may satisfy $(r2-r1)/h > 0.30$.

In the silicon carbide single crystal manufacturing apparatus according to the first aspect, the base may be made of a graphite material with a Young's modulus of 5 GPa or more.

According to a second aspect of the disclosure, there is provided a method of manufacturing a silicon carbide single crystal in which the silicon carbide seed crystal and a silicon carbide raw material are placed in the crucible and a sublimation gas sublimated from the silicon carbide raw material is precipitated on the seed crystal to grow a silicon carbide single crystal, using a crucible constituted by a crucible body and a crucible lid and a base having a crucible lid side surface supported by the lower surface of the crucible lid, and a seed crystal mounting surface on which the seed crystal is mounted and which is a surface on the opposite side of the crucible lid side surface, wherein the base is made of graphite material, the area of the seed crystal mounting surface is larger than the area of the crucible lid side surface, and the base has at least of a portion in which the cross-sectional area orthogonal to the vertical direction connecting the crucible lid side surface and the seed crystal mounting surface is gradually reduced, and a portion that is getting smaller gradually, from the surface of the seed crystal mounting surface toward the crucible lid side surface.

In the method of manufacturing a silicon carbide single crystal according to the second aspect, a stress buffering member may be arranged between the seed crystal and the base.

In the method of manufacturing a silicon carbide single crystal according to the second aspect, the stress buffer member may have a Young's modulus of less than 5 GPa.

In the method of manufacturing a silicon carbide single crystal according to the second aspect, the outer diameter of the seed crystal may be 150 mm or more.

In the method of manufacturing a silicon carbide single crystal according to the second aspect, the outer diameter of the seed crystal may be 200 mm or more.

Advantageous Effects of Invention

According to the present disclosure, it is possible to provide a silicon carbide single crystal manufacturing apparatus capable of reducing the shear stress caused by the difference in the thermal expansion coefficient between the silicon carbide seed crystal and the graphite base.

BRIEF DESCRIPTION OF DRAWINGS

FIG. 10 is a shape of Example 1 and the simulation result thereof, except for the case where r1=80 mm among the simulated shapes.

FIG. 13 is a shape of Example 2 and the simulation result thereof, except for the case where r1=80 mm among the simulated shapes.

FIG. 15 is a shape of Example 3 and the simulation result thereof, except for the case where r1=100 mm among the simulated shapes.

DESCRIPTION OF EMBODIMENTS

Figure 1:
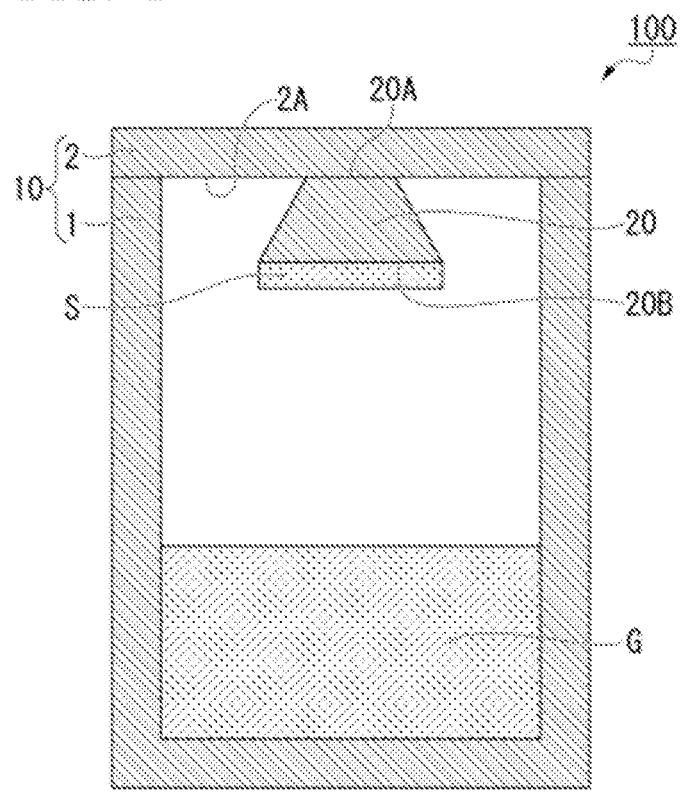
FIG. 1 is a cross-sectional schematic diagram of an example of the silicon carbide single crystal manufacturing apparatus which is one embodiment of the present disclosure.

Hereinafter, embodiments of the present disclosure will be described with reference to the drawings. In each of the following embodiments, the same or equal parts may be designated by the same reference numerals in the drawings. Further, in the drawings used in the following description, the featured portion may be enlarged for convenience in order to make the feature easy to understand, and the dimensional ratio of each component may not be the same as the actual one. Further, the materials, dimensions, etc. exemplified in the following description are examples, and the present disclosure is not limited thereto, and can be appropriately modified and carried out within the range in which the effects of the present disclosure are exhibited.

(Silicon Carbide Single Crystal Manufacturing Apparatus)

Figure 2:
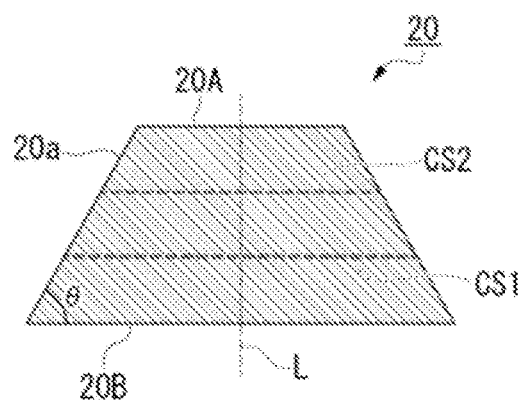
FIG. 2 is a cross-sectional schematic diagram which took out only the base from the silicon carbide single crystal manufacturing apparatus shown in FIG. 1.

FIG. 1 is a cross-sectional schematic diagram of an example of the silicon carbide single crystal manufacturing apparatus which is one embodiment of the present disclosure. FIG. 2 is a schematic cross-sectional view of the silicon carbide single crystal manufacturing apparatus shown in FIG. 1 in which only the base is taken out.

A silicon carbide single crystal manufacturing apparatus 100 shown in FIG. 1 includes a crucible 10 constituted by a crucible body 1 and a crucible lid 2, and a base 20 having a surface 20A on the crucible lid side (the crucible lid side surface) supported by the lower surface 2A of the crucible lid 2 and a seed crystal mounting surface 20B on which the seed crystal S is mounted and which is a surface on the opposite side of the crucible lid side surface 20A, in which the base 20 is made of graphite material, the area of the seed crystal mounting surface 20B is larger than the area of the crucible lid side surface 20A, and the base 20 has a portion in which the cross-sectional area orthogonal to the vertical direction connecting the crucible lid side surface 20A and the seed crystal mounting surface 20B is gradually reduced from the surface of the seed crystal mounting surface 20B toward the crucible lid side surface 20A.

A heat insulating material (not shown) for keeping the crucible 10 warm and a heating means (not shown) are provided on the outer periphery of the crucible body 1. In FIG. 1, a single crystal growth raw material (raw material powder) G and a seed crystal S are also shown to help understanding.

In the production of the silicon carbide single crystal, the raw material powder G is filled in the bottom of the crucible 10 and the seed crystal S made of silicon carbide is placed on the base 20. The base 20 is located at a position facing the raw material powder G. Next, the crucible 10 is heated to about 2100 to 2400° C. in a reduced pressure atmosphere to sublimate the raw material powder G, whereby the sublimation gas (raw material gas) is supplied onto the seed crystal S. The raw material gas sublimated from the raw material powder G is recrystallized on the surface of the seed crystal S, so that the silicon carbide single crystal grows.

<Crucible>

The crucible 10 is a crucible for producing a silicon carbide single crystal by a sublimation method, and includes a crucible body 1 and a crucible lid 2. As long as the crucible body 1 and the crucible lid 2 can form a crystal growth space together, there is no limitation on the shape.

As the crucible 10, for example, one made of graphite can be used. The crucible 10 becomes hot during crystal growth. Therefore, it needs to be made of a material that can withstand high temperatures. Graphite has an extremely high sublimation temperature of 3550° C. and can withstand high temperatures during growth.

When the crucible 10 is made of graphite (graphite material), its surface may be coated with TaC or SiC.

<Base>

The base 20 shown in FIG. 1 is a member separated from the crucible lid 2, but may be integrally formed with the crucible lid 2. When the base 20 and the crucible lid 2 are separate members, they may be joined with, for example, a carbon adhesive or the like.

Like the crucible 10, the base 20 needs to be made of a material that can withstand a high temperature when growing a single crystal, and in this embodiment, it is made of graphite (graphite material).

The base is preferably made of a graphite material having a Young's modulus of 5 GPa or more at room temperature. This is because it has rigidity that can stably support a silicon carbide single crystal.

The surface of the base 20 made of a graphite material may be coated with TaC or SiC.

In the base 20, the area Sb of the seed crystal mounting surface 20B is larger than the area Sa of the crucible lid side surface 20A, the cross-sectional area orthogonal to the straight line L extending in the vertical direction connecting the crucible lid side surface 20A and the seed crystal mounting surface 20B is gradually reduced from the surface of the seed crystal mounting surface 20B toward the crucible lid side surface 20A.

Reference numerals CS1 and CS2 in FIG. 2 indicate the positions of the two cross-sectional areas, and the cross-sectional area CS2 closer to the lid side surface 20A is smaller than the cross-sectional area CS1 closer to the seed crystal mounting surface 20B.

The base 20 shown in FIG. 2 has a truncated cone shape. In this case, in the vertical cross-sectional view as shown in FIG. 2, the side surface 20a is linear, and a predetermined angle θ can be defined with respect to the crucible lid side surface 20A or the seed crystal mounting surface 20B.

In the base 20 shown in FIG. 2, the cross-sectional area of the base 20 is continuously reduced from the seed crystal mounting surface 20B toward the crucible lid side surface 20A, and the radius of the circle in its cross section is continuously reduced at a constant rate.

The thermal expansion coefficient of graphite (graphite material) constituting the base 20 does not match the thermal expansion coefficient of silicon carbide constituting the seed crystal in the entire wide temperature range from normal temperature to 2400° C. or higher where the sublimation method is used. Therefore, shear stress is generated at the joint surface (adhesive surface) between the graphite base and the silicon carbide seed crystal. In particular, the expansion difference becomes large in the outer peripheral portion of the seed crystal. When this shear stress becomes large, a gap is formed between the seed crystal and the base due to poor bonding, which leads to the occurrence of macro defects in the crystal.

On the other hand, by making the shape of the base a truncated cone shape, it is possible to suppress such shear stress and reduce macro defects of silicon carbide seed crystals.

Figure 3:
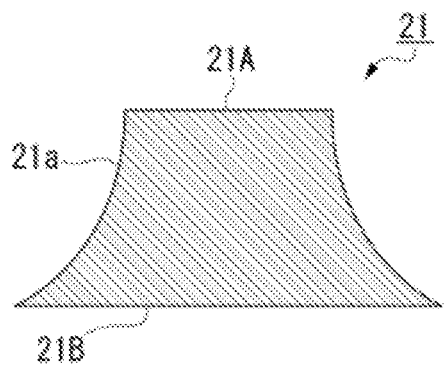
FIG. 3 is a cross-sectional schematic diagram of the base of another example.

FIG. 3 shows another example of the configuration in which the cross-sectional area of the base gradually decreases from the seed crystal mounting surface toward the crucible lid side surface.

In the base 21 shown in FIG. 3, a feature that the area Sb of the seed crystal mounting surface 21B is larger than the area Sa of the crucible lid side surface 21A, and the cross-sectional area thereof gradually decreases from the seed crystal mounting surface 21B toward the crucible lid side surface 21A, that is, a feature that the size is continuously reduced from the seed crystal mounting surface 21B toward the lid side surface 21A is common to the base 20 shown in FIG. 2.

On the other hand, in the base 21 shown in FIG. 3, a feature in which the base 21 has a smaller rate of decrease in cross-sectional area from the seed crystal mounting surface 21B toward the crucible lid side surface 21A, and the side surface 21a is formed in a concave shape (curved shape), is different from the base 20 shown in FIG. 2.

Figure 4:
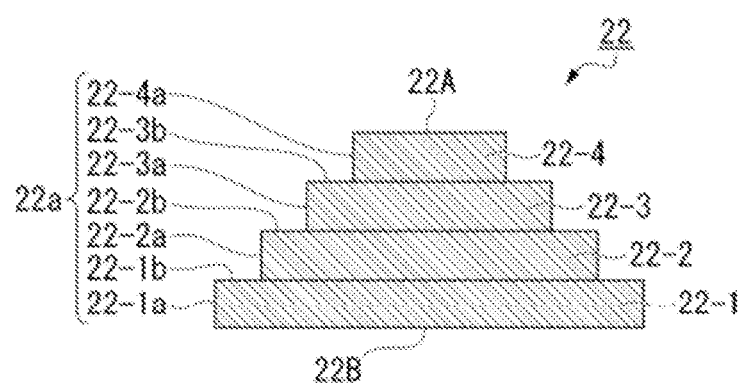
FIG. 4 is a cross-sectional schematic diagram of the base of another example.

FIG. 4 shows an example of a configuration in which the cross-sectional area of the base decreases stepwise from the seed crystal mounting surface toward the crucible lid side surface.

The base 22 shown in FIG. 4 is common to the base 20 shown in FIG. 2 and the base 21 shown in FIG. 3 in that the area Sb of the seed crystal mounting surface 22B is larger than the area Sa of the crucible lid side surface 22A.

On the other hand, a feature that the cross-sectional area of the base 22 shown in FIG. 4 decreases stepwise from the seed crystal mounting surface 22B toward the crucible lid side surface 22A is different from shown in the base 20 shown in FIG. 2 and the base 21 shown in FIG. 3.

The base 22 shown in FIG. 4 has a shape in which four discs (or cylinders) 22-1, 22-2, 22-3, 22-4 having smaller radii in order from the seed crystal mounting surface 22B toward the crucible lid side surface 22A are stacked. The cross-sectional area of each disk is the same. The four discs may be integrally formed, or the four discs may be joined by, for example, a carbon adhesive or the like.

The side surface 22a of the base 22 is composed of side surfaces 22-1a, 22-2a, 22-3a, 22-4a extending in a direction orthogonal to the seed crystal mounting surface 22B (or the crucible lid side surface 22A), and side surfaces 22-1b, 22-2b, and 22-3b extending in a direction parallel to the seed crystal mounting surface 22B (or the crucible lid side surface 22A).

The base 22 shown in FIG. 4 is configured to be composed of four discs, but this is an example, and the number is not limited as long as it is composed of a plurality of discs.

Figure 5:
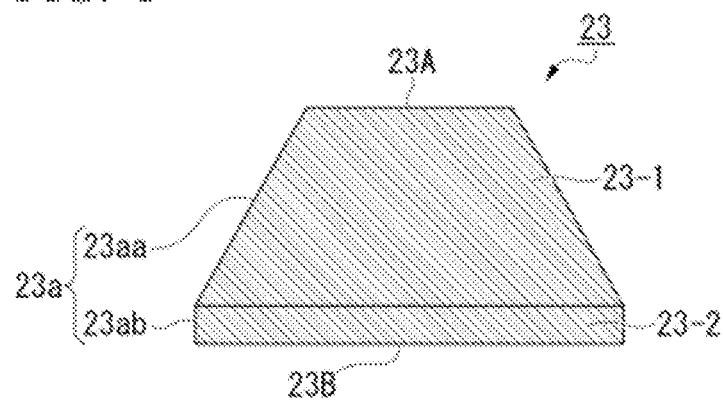
FIG. 5 is a cross-sectional schematic diagram of the base of another example.

FIG. 5 shows an example of a base including a portion where the cross-sectional area gradually decreases from the seed crystal mounting surface toward the crucible lid side surface (hereinafter, it may be referred to as "cross-sectional area reduction portion") and a portion where the cross-sectional area does not change (hereinafter, it may be referred to as "cross-sectional area invariant portion").

The base 23 shown in FIG. 5 has the same feature as the base 20 shown in FIG. 2 in that the area Sb of the seed crystal mounting surface 23B is larger than the area Sa of the crucible lid side surface 23A.

On the other hand, in a base 23 shown in FIG. 5, a feature having a portion 23-2 in which the cross-sectional area does not change, other than the portion 23-1 in which the cross-sectional area gradually decreases from the seed crystal mounting surface 23B toward the crucible lid side surface 23A is different from the base 20 shown in FIG. 2.

The portion where the cross-sectional area gradually decreases from the seed crystal mounting surface 23B toward the crucible lid side surface 23A and the portion where the cross-sectional area does not change may be integrally formed, or for example, may be bonded with a carbon adhesive or the like.

The base 23 shown in FIG. 5 has one cross-sectional area reduction portion and one cross-sectional area invariant portion, but the number is not limited as long as it has at least one cross-sectional area reduction portion.

Figure 6:
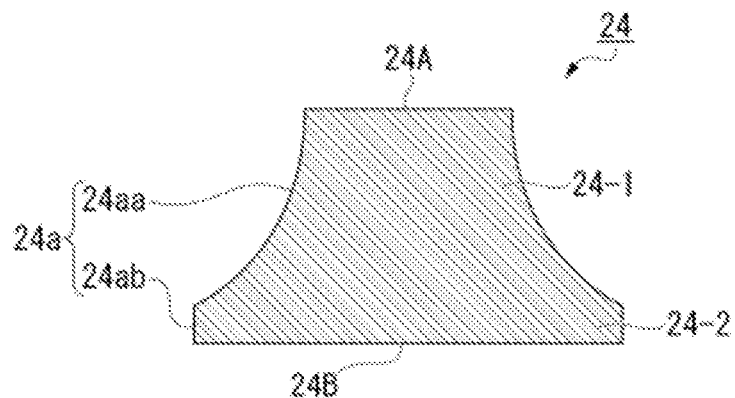
FIG. 6 is a cross-sectional schematic diagram of the base of another example.

FIG. 6 shows an example of a base including a portion where the cross-sectional area gradually decreases from the seed crystal mounting surface toward the crucible lid side surface (hereinafter, it may be referred to as "cross-sectional area reduction portion") and a portion where the cross-sectional area does not change (hereinafter, it may be referred to as "cross-sectional area invariant portion").

The base 24 shown in FIG. 6 has the same feature as the base 21 shown in FIG. 3 in that the area Sb of the seed crystal mounting surface 24B is larger than the area Sa of the crucible lid side surface 24A.

On the other hand, in a base 24 shown in FIG. 6, a feature having a portion 24-2 in which the cross-sectional area does not change, other than the portion 24-1 in which the cross-sectional area gradually decreases from the seed crystal mounting surface 24B toward the crucible lid side surface 24A is different from the base 21 shown in FIG. 3.

The portion where the cross-sectional area gradually decreases from the seed crystal mounting surface 24B toward the crucible lid side surface 24A and the portion where the cross-sectional area does not change may be integrally formed, or for example, may be bonded with a carbon adhesive or the like.

The base 24 shown in FIG. 6 has one cross-sectional area reduction portion and one cross-sectional area invariant portion, but the number is not limited as long as it has at least one cross-sectional area reduction portion.

(Method of Manufacturing Silicon Carbide Single Crystal)

In a method of manufacturing a silicon carbide single crystal according to an embodiment of the present disclosure in which the silicon carbide seed crystal and a silicon carbide raw material are placed in the crucible and a sublimation gas sublimated from the silicon carbide raw material is precipitated on the seed crystal to grow a bulk silicon carbide single crystal, using a crucible constituted by a crucible body and a crucible lid, and a base that is placed on the underside of the crucible lid and holds a silicon carbide seed crystal, wherein the base is made of graphite material, the area of the seed crystal mounting surface is larger than the area of the crucible lid side surface, and the base has at least of a portion in which the cross-sectional area orthogonal to the vertical direction connecting the crucible lid side surface and the seed crystal mounting surface is gradually reduced, and a portion that is getting smaller gradually, from the surface of the seed crystal mounting surface toward the crucible lid side surface.

The base and the seed crystal can be adhered (bonded) using a carbon adhesive or the like. The carbon adhesive is obtained by dispersing carbon powder in an organic solvent, and by volatilizing the solvent, it can be adhered (bonded) without impairing the characteristics of the carbon material.

Figure 7:
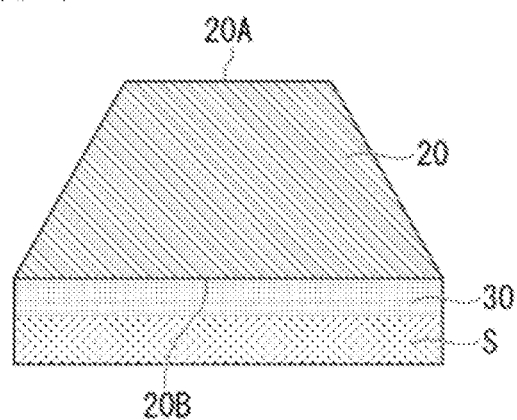
FIG. 7 is a cross-sectional schematic diagram showing the structure in which the stress buffering member is arranged between the seed crystal and the base.

FIG. 7 shows, as an example, a configuration in which the stress buffering member 30 is arranged between the seed crystal S and the base 20 when the base 20 shown in FIG. 2 is used. The stress buffering member may be arranged between the base having another configuration and the seed crystal S.

In this method for manufacturing a silicon carbide single crystal, a stress buffering member (stress buffering layer) arranged between the seed crystal and the base may be used for the purpose of reducing the stress applied to the seed crystal S during growth.

As mentioned above, the thermal expansion coefficient of graphite (graphite material) constituting the base 20 does not match the thermal expansion coefficient of silicon carbide constituting the seed crystal in the entire wide temperature range from normal temperature to 2400° C. or higher where the sublimation method is used. Therefore, shear stress is generated at the joint surface (adhesive surface) between the graphite base and the silicon carbide seed crystal. In particular, the expansion difference becomes large in the outer peripheral portion of the seed crystal. When this shear stress becomes large, a gap is formed between the seed crystal and the base due to poor bonding, which leads to the occurrence of macro defects in the crystal.

On the other hand, by providing the stress buffering member 30 between the seed crystal S and the base 20, such shear stress can be suppressed, and macro defects of the silicon carbide seed crystal can be reduced.

The stress buffering member preferably has a Young's modulus of less than 5 GPa. As the stress buffering member having a Young's modulus of less than 5 GPa, a carbon sheet or the like can be exemplified.

In this method for manufacturing a silicon carbide single crystal, a seed crystal S having an outer diameter of 150 mm or more can be used. Further, those having an outer diameter of 200 mm or more can also be used.

EXAMPLES

Example 1

Figure 8:
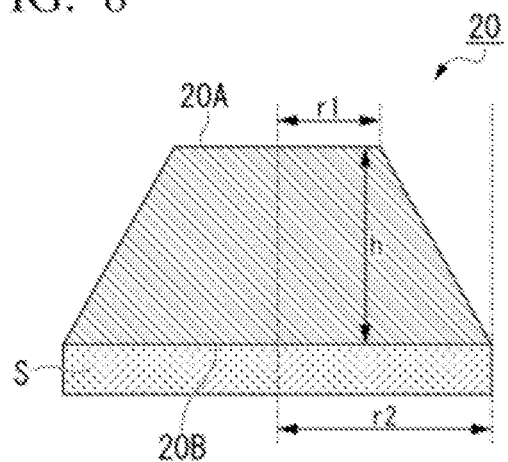
FIG. 8 is a diagram for explaining the shape parameter of the base of Example 1.
Figure 9:
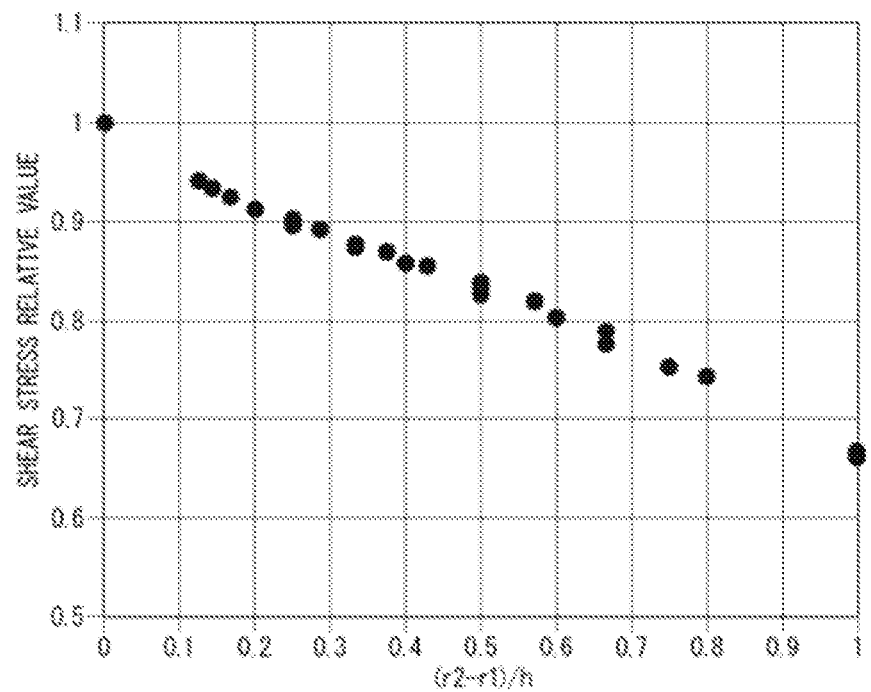
FIG. 9 is a result of the relative value of the shear stress obtained in each shape, where the shear stress is 1 when the base has a cylindrical shape in Example 1.

The configuration shown in FIG. 2 (the configuration in which the silicon carbide seed crystal and the base are directly bonded (adhered) without using a stress buffering member) is reproduced by simulation, and the shear stress generated between the silicon carbide seed crystal and the base when a temperature of 1000° C., which is the elastic region of the material, is applied, is evaluated based on the shape parameter of the base. FIG. 8 is a diagram for explaining the shape parameters of the base, and FIG. 9 is a result of the relative value of the shear stress obtained in each shape, where the shear stress is 1 when the base has a cylindrical shape.

General-purpose FEM analysis software ANSYS Mechanical (ANSYS, Inc.) was used for the simulation. In order to reduce the computational load, the simulation dealt with the structure of half of an arbitrary cross section passing through the central axis, and performed a two-dimensional simulation. The simulation conditions are as shown below.

The thickness of silicon carbide seed crystal: 3 mm,
The radius of silicon carbide seed crystal: 80 mm,
r2 (Radius of seed crystal mounting surface (see FIG. 8): 80 mm.

In addition, as the physical property values of various materials, typical values were used as shown in Table 1.

TABLE 1

| MEMBER | SILICON CARBIDE | GRAPHITE BASE | STRESS BUFFERING MEMBER |
|---|---|---|---|
| DENSITY[kg/m$^3$] | 3210 | 1800 | 1000 |
| YOUNG'S MODULUS[Gpa] | 500 | 10 | 1 |
| POISSON'S RATIO[—] | 0.3 | 0.3 | 0.3 |
| THERMAL EXPANSION COEFFICIENT[1/K] | 5.0e−6 | 5.5e−6 | 0 |

In FIG. 9, the horizontal axis is the shape parameter (r2−r1)/h, and the vertical axis is the relative value of the shear stress. As shown in FIG. 8, r1 is the radius of the crucible lid side surface, r2 is the radius of the seed crystal mounting surface, and h is the height (thickness) of the base. FIG. 9 shows the results of a comprehensive simulation in which the radius r1 of the crucible lid side surface of the base and the height h of the base are changed by 10 mm in the range of 40 to 80 mm and 20 to 80 mm, respectively.

It can be seen that the shear stress generated between the silicon carbide seed crystal and the base is suppressed by 10% or more in the range of (r2−r1)/h>0.30.

By reducing the shear stress generated between the silicon carbide seed crystal and the base by 10%, it is possible to suppress poor bonding (adhesion) at the bonding (adhesion) portion.

FIG. 10 shows the shape of Example 1 and the simulation result thereof, except for the case where r1=80 mm among the simulated shapes.

Based on the results shown in FIG. 10, when the radius r1 is the same, the lower the height h, the smaller the shear stress, and when the height h is the same, the smaller the radius r1, the smaller the shear stress.

When the height h was 20 mm to 40 mm, the relative value of the shear stress was 0.90 or less regardless of the radius r1 of 40 mm to 70 mm. That is, the shear stress generated between the silicon carbide seed crystal and the base is suppressed by 10% or more.

Example 2

Example 2 is different from Example 1 in that it has a stress buffering member (stress buffering layer) between the silicon carbide seed crystal and the base, but other conditions are common. The thickness of the stress buffering member is 1 mm, and the physical property values used are as shown in Table 1.

Figure 11:
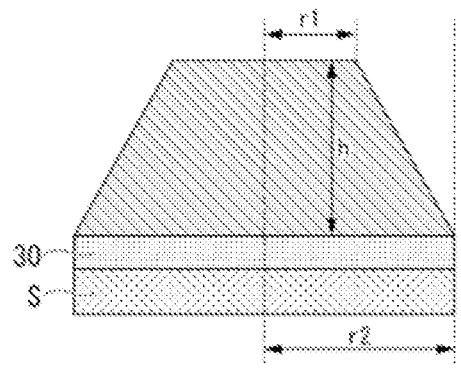
FIG. 11 is a diagram for explaining the shape parameters of the base in Example 2.
Figure 12:
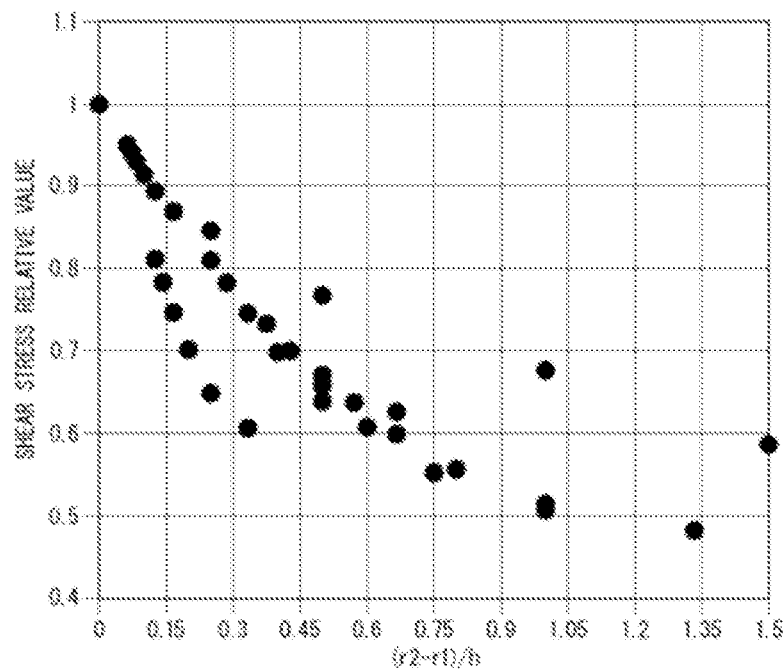
FIG. 12 is a result of relative values of the shear stress obtained in each shape, where the shear stress is 1 when the base has a cylindrical shape in Example 2.

FIG. 11 is a diagram for explaining the shape parameters of the base. FIG. 12 shows the results of relative values of the shear stress obtained in each shape, where the shear stress is 1 when the base has a cylindrical shape. The shear stress generated in the stress buffer member was evaluated at the position ½ in the height direction.

FIG. 12 shows the results of a comprehensive simulation in which the radius r1 of the crucible lid side surface of the base and the height h of the base are changed by 10 mm in the range of 40 to 80 mm and 20 to 80 mm, respectively.

Similar to FIG. 9, the horizontal axis is the shape parameter (r2−r1)/h, and the vertical axis is the relative value of the shear stress. As shown in FIG. 8, r1 is the radius of the crucible lid side surface, r2 is the radius of the seed crystal mounting surface, and h is the height (thickness) of the base (see, FIG. 11).

It can be seen that the shear stress generated at the evaluation position is suppressed by 10% or more in the range of (r2−r1)/h>0.15.

By reducing the shear stress at the evaluation position by 10%, it is possible to suppress tearing (cracks) of the stress buffering member.

In FIG. 12, when the x-axis is 0, the value of the shear stress is in the range of 1 to 3 MPa, and the suppression of the shear stress of 10% in this range corresponds to 0.1 to 0.3 MPa.

The strength of graphite varies depending on the material, but when a graphite sheet (carbon sheet) having a Young's modulus of less than 5 GPa is used as the stress buffering member, the tensile strength thereof is generally about several MPa. The shear strength is smaller than the tensile strength, and the shear strength is further reduced in a member such as a carbon sheet having anisotropy. Therefore, it is considered that stress suppression of several MPa or less has a sufficient effect on cracks in the stress buffering member.

FIG. 13 shows the shape of Example 2 and the simulation result thereof, except for the case where r1=80 mm among the simulated shapes.

Based on the results shown in FIG. 13, when the radius r1 was 40 to 70 mm and the height h was 20 to 80 mm, the relative value of the shear stress was 0.81 or less. That is, the shear stress generated between the silicon carbide seed crystal and the base is suppressed by about 20%.

Further, when the radius r1 was 40 mm to 60 mm and the height h was 20 mm to 50 mm, the relative value of the shear stress was 0.70 or less. That is, the shear stress generated between the silicon carbide seed crystal and the base is suppressed by 30% or more.

Example 3

Example 3 is different from Example 2 in that the radius r2 of the crystal mounting surface is changed to 100 mm, but other conditions are common.

Figure 14:
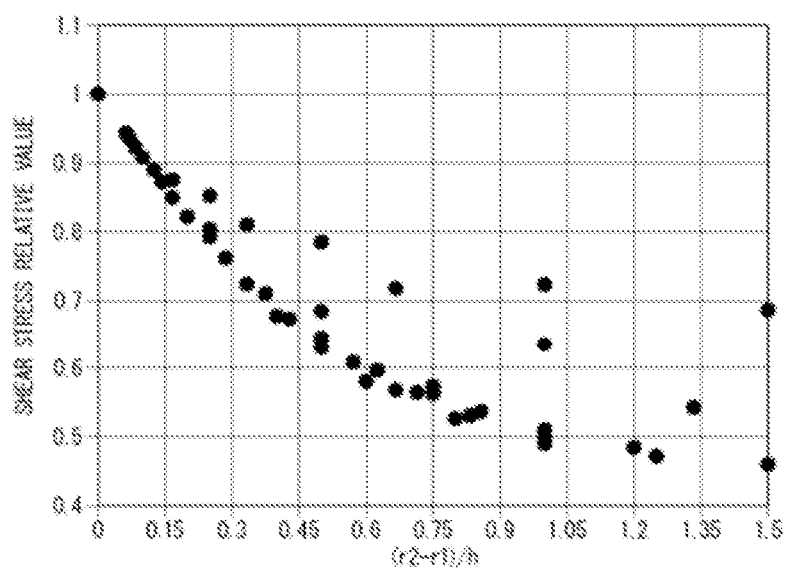
FIG. 14 is a result of relative values of the shear stress obtained in each shape, where the shear stress is 1 when the base has a cylindrical shape in Example 3.

FIG. 14 shows the results of a simulation in which the radius r1 of the crucible lid side surface of the base and the height h of the base are changed in the range of 40 to 100 mm and 20 to 80 mm, respectively.

It can be seen that the shear stress generated at the evaluation position is suppressed by 10% or more in the range of (r2−r1)/h>0.15.

By reducing the shear stress at the evaluation position by 10%, it is possible to suppress tearing (cracks) of the stress buffering member.

FIG. 15 shows the shape of Example 3 and the simulation result thereof, except for the case where r1=100 mm among the simulated shapes.

Based on the results shown in FIG. 15, when the radius r1 was 40 to 90 mm and the height h was 20 to 80 mm, the relative value of the shear stress was 0.90 or less. That is, the shear stress generated between the silicon carbide seed crystal and the base is suppressed by 10% or more.

Further, when the radius r1 was 40 mm to 80 mm and the height h was 20 mm to 50 mm, the relative value of the shear stress was 0.72 or less. That is, the shear stress generated between the silicon carbide seed crystal and the base is suppressed by about 30%.

REFERENCE SIGNS LIST

1: crucible body
2: crucible lid
10: crucible
20, 21, 22, 23, 24: base
20A, 21A, 22A, 23A, 24A: crucible lid side surface
20B, 21B, 22 B, 23B, 24 B: seed crystal mounting surface
30: stress buffering member
100: silicon carbide single crystal manufacturing apparatus

What is claimed is:

1. A silicon carbide single crystal manufacturing apparatus, comprising:
    a crucible comprising a crucible body and a crucible lid; and
    a base comprising a crucible lid side surface supported by a lower surface of the crucible lid and a seed crystal mounting surface operable to have a seed crystal mounted thereon, wherein the seed crystal mounting surface is disposed on a side of the base opposite from the crucible lid side surface,
    wherein the base is made of graphite material,
    the area of the seed crystal mounting surface is larger than the area of the crucible lid side surface, and a cross-sectional area of the base orthogonal to a vertical direction connecting the crucible lid side surface and the seed crystal mounting surface is continuously reduced from the seed crystal mounting surface toward the crucible lid side surface.

2. The silicon carbide single crystal manufacturing apparatus according to claim 1,
    wherein the base has a truncated cone shape.

3. The silicon carbide single crystal manufacturing apparatus according to claim 1,
    wherein, assuming that the crucible lid side surface of the base is circular and has a radius r1, the seed crystal mounting surface is circular and has a radius r2, and a height of the base is h, (r2−r1)/h>0.15 is satisfied.

4. The silicon carbide single crystal manufacturing apparatus according to claim 3,
    wherein the radius r1, the radius r2, and the height h satisfy (r2−r1)/h>0.30.

5. The silicon carbide single crystal manufacturing apparatus according to claim 1,
    wherein the base is made of a graphite material with a Young's modulus of 5 GPa or more.

6. A method of manufacturing a silicon carbide single crystal, comprising:
    providing a crucible comprising a crucible body, a crucible lid and a base, the base comprising a crucible lid side surface supported by a lower surface of the crucible lid and a seed crystal mounting surface operable to have a seed crystal mounted thereon, wherein the seed crystal mounting surface is disposed on a side of the base opposite from the crucible lid side surface;
    mounting the seed crystal to the seed crystal mounting surface and placing a silicon carbide raw material in the crucibles;
    sublimating the silicon carbide raw material to form a sublimation gas; and
    precipitating the sublimation gas on the seed crystal to grow the silicon carbide single crystal,
    wherein the base is made of graphite material,
    an area of the seed crystal mounting surface is larger than an area of the crucible lid side surface, and
    a cross-sectional area of the base orthogonal to a vertical direction connecting the crucible lid side surface and the seed crystal mounting surface is continuously reduced from the seed crystal mounting surface toward the crucible lid side surface.

7. The method of manufacturing a silicon carbide single crystal according to claim 6,
    wherein a stress buffering member is arranged between the seed crystal and the base.

8. The method of manufacturing a silicon carbide single crystal according to claim 7,
    wherein the stress buffering member has a Young's modulus of less than 5 GPa.

9. The method of manufacturing a silicon carbide single crystal according to claim 6,
    wherein an outer diameter of the seed crystal is 150 mm or more.

10. The method of manufacturing a silicon carbide single crystal according to claim 9,
    wherein the outer diameter of the seed crystal is 200 mm or more.

11. A silicon carbide single crystal manufacturing apparatus, comprising:
    a crucible comprising a crucible body and a crucible lid; and
    a base consisting of a cross-sectional area reduction portion and a cross-sectional area invariant portion, wherein the cross-sectional area reduction portion comprises a crucible lid side surface of the base supported by a lower surface of the crucible lid and the cross-sectional area invariant portion comprises a seed crystal mounting surface operable to have a seed crystal mounted thereon, wherein the seed crystal mounting surface is disposed on a side of the base opposite from the crucible lid side surface,
    wherein the base is made of graphite material, the area of the seed crystal mounting surface is larger than the area of the crucible lid side surface, and a cross-sectional area of the base orthogonal to a vertical direction connecting the crucible lid side surface and the seed crystal mounting surface is invariant in the cross-sectional area invariant portion, and the cross-sectional area of the cross-sectional area reduction portion is continuously reduced from a boundary between the cross-sectional area invariant portion and the cross-sectional area reduction portion toward the crucible lid side surface.

* * * * *